United States Patent
Shalish

(10) Patent No.: US 6,477,698 B1
(45) Date of Patent: Nov. 5, 2002

(54) ENCAPSULATION OF HDL PROCESS DESCRIPTIONS TO PROVIDE GRANULARITY AT THE PROCESS LEVEL

(76) Inventor: Khalil Shalish, 9708 Indigo Brush Dr., Austin, TX (US) 78726

( * ) Notice: Subject to any disclaimer, the term of this patent is extended or adjusted under 35 U.S.C. 154(b) by 0 days.

(21) Appl. No.: 09/436,558

(22) Filed: Nov. 9, 1999

(51) Int. Cl.[7] .............................. G06F 17/50; G06F 9/45
(52) U.S. Cl. ............................... 716/18; 716/3; 717/108
(58) Field of Search .................... 716/1–21; 703/14–16; 707/103 R, 103 Y, 103, 103 Z; 717/100–110

(56) References Cited

U.S. PATENT DOCUMENTS

| | | | |
|---|---|---|---|
| 5,754,826 A | * | 5/1998 | Gamal et al. .................. 703/14 |
| 5,870,588 A | * | 2/1999 | Rompaey et al. ............. 703/13 |
| 5,872,810 A | * | 2/1999 | Philips et al. ................ 375/222 |
| 5,987,239 A | * | 11/1999 | Kirsch ........................... 716/1 |
| 6,053,947 A | * | 4/2000 | Parson ......................... 703/14 |
| 6,152,612 A | * | 11/2000 | Liao et al. ..................... 703/23 |
| 6,173,435 B1 | * | 1/2001 | Dupenloup ................... 716/18 |
| 6,421,634 B1 | * | 7/2002 | Dearth et al. ................. 703/14 |
| 6,421,818 B1 | * | 7/2002 | Dupenloup et al. ........... 716/18 |

FOREIGN PATENT DOCUMENTS

WO   WO95/27948   4/1995   ........... G06F/17/50

OTHER PUBLICATIONS

NN9511131 ("Shared Variable Support using Optimistic Execution", IBM Technical Disclosure Bulletin, vol. 38, No. 11, Nov. 1995, pp. 131–136 (8 pages)).*

Verschueren ("Rule base driven conversion of an object oriented design data structure into standard hardware description languages", Proceedings of 24th Euromicro Conference, vol. 1, Aug. 25, 1998, pp. 42–45).*

Bezzi et al. ("CASTOR: an expert advisor for testability enhancement of VLSI systems", Proceedings of the tenth Conference on Artificial Intelligence for Applications, Mar. 1, 1994, pp. 9–15).*

Ashenden et al. ("SUAVE: painless extension for an object-oriented VHDL", Proceedings of VHDL International User's Forum, Oct. 19, 1997, pp. 60–67).*

Famorzadeh et al. ("Rapid prototyping of DSP systems via system interface module generation", Proceedings of 1996 IEEE International Conference on Acoustics, Speech, and Signal Processing, vol. 2, May 7, 1996, pp. 1256–1259).*

Smith ("Writing style for architectural synthesis", Proceedings of 1995 International Verilog HDL Conference, Mar. 27, 1995, pp. 106–113.*

Ashenden et al. ("A Comparison of Alternative Extensions for Data Modeling in VHDL", IEEE Proceeding of 31st Annual Hawaii International Conference on System Sciences, vol. 3, Jan. 6, 1998, pp. 207–215).*

Nijhar, T.P.K., "HDL–Specific Source Level Behavioural Optimisation", IEE Proceedings: Computers and Digital Techniques, IEE, GB, vol. 144, No. 2, Mar 97, pp138–144.

Nijhar, T.P.K., "Source Level Optimisation of VHDL for Behavioural Synthesis," IEE Proceedings:Computers and Digital Techniques, vol. 144, No. 1, Jan. 97, pp. 1–6.

* cited by examiner

Primary Examiner—Matthew Smith
Assistant Examiner—Phallaka Kik
(74) Attorney, Agent, or Firm—Michael O. Scheinberg

(57) ABSTRACT

A system and method for providing encapsulation of HDL descriptions at the processes level includes a computer which accesses an Process Encapsulation computer program stored in computer memory. A computer processor which is electrically connected to the computer memory executes the Process Encapsulation computer program to encapsulate HDL processes as independent HDL objects within the structure of an HDL behavioral description.

18 Claims, 4 Drawing Sheets

ENCAPSULATION OF HDL PROCESS DESCRIPTIONS TO PROVIDE GRANULARITY AT THE PROCESS LEVEL

TECHNICAL FIELD OF THE INVENTION

The present invention relates to increasing the granularity of the behavior level of Hardware Description Languages (HDL). The invention results in extending the usefulness of applications that use HDL behavior level descriptions to define the design, but require a finer level of granularity to perform the required task. More specifically, this invention relates to a system and method for transforming the integrated processes within the HDL behavior description to independent HDL objects.

BACKGROUND OF THE INVENTION

HDL is an acronym for Hardware Description Language. HDLs provide the means of specifying a digital system or design at various levels of abstraction. HDLs have evolved into two standards: Verilog and VHDL. The terms "design" and "digital system" are used interchangeably throughout this description. An HDL behavioral description is an abstraction of how a digital system works described with HDL in the following manner: the function of the digital system is described in terms of its inputs but no effort is made to describe how the digital system is implemented in terms of logic gates. An HDL process is the basic essence of the HDL behavioral description. A process can be thought of as independent concurrent thread of control. HDL processes are integral part of HDL module/entity (refer to the definition of HDL module/entity bellow). An HDL module or entity is a self-contained block of HDL descriptions that can reused through instantiation. HDL modules/entities contain processes and instantiations of other modules/entities. HDL module corresponds to the definition of module in the Verilog HDL. HDL entity corresponds to the definition of entity in the VHDL HDL. The terms HDL module and HDL entity are used interchangeably throughout this description. An HDL gate is an HDL module/entity which describes a generic logic function or technology specific logic function. An HDL object is a self-contained independent block within the HDL description that can be reused through instantiation. HDL objects can be defined explicitly and implicitly. Explicit HDL objects are formally defined within the HDL description. Examples of explicit HDL objects are HDL module/entities and HDL gates. Implicit HDL objects are described in a non-HDL (HDL tool specific) format or implied through the internal data structure of a HDL tool.

Structural gate level description is the representation of the design in terms logic gates or technology specific components. This representation can be described using HDLs or specific formats such as EDIF, XNF. Typically, the structural gate level description is the output of the synthesis process (which is the process of transforming HDL Behavioral description into a structural gate level description). Partitioning is the process of distribution of logic amongst multiple devices. Typically, the distribution process must comply with a set of constraints characteristic of the devices. For example, in case of partitioning into multiple FPGA devices, the partitioning process must meet the logic capacity and I/O limits of the FPGA devices. Floorplanning is the process of placement or arrangement of logic within a device to achieve a desired performance goal. For example, in case of floorplanning an FPGA device, the goal of the placement of logic is such that the clock speed of the design implemented in the FPGA device is increased and/or the route time of the FPGA device is reduced. For structural gate level description, logic size means the amount of logic resources used to implement a logic function (where the logic resources can be generic (technology independent) logic gates or technology specific components) and granularity means the average logic size of the objects used in the description of a design (where a design can have multiple granularities if it is described in a hierarchical fashion).

The structural gate level description is the prevalent starting point for many physical layout EDA (Electronic Design Automation) tools. The structural gate level description was the prevalent level of abstraction for digital design until the increases in complexity required a higher level of abstraction. A subset of the HDL behavioral description, commonly referred to as the RTL (Register Transfer Level) description, is now considered the starting point for Application Specific Integrated Circuit (ASIC) design.

The typical ASIC EDA methodology is to transform (with an aid of a synthesis tool) the HDL behavioral description of the design into a structural gate level description.

In order to perform effective partitioning and floorplanning of the design, the granularity of the design plays a critical role in achieving an optimum solution. Given the current ASIC EDA methodology, one has two choices for a starting point for the partitioning and floorplanning tasks: HDL behavioral description or structural gate level description. The HDL behavioral description is the preferred one, since it is the starting point of the ASIC EDA methodology and it is a familiar representation of the design to the designer. Both descriptions, the HDL behavioral description and the structural gate level description, can contain only two levels of object granularity: module/entity object granularity and gate object granularity. The module/entity granularity is rather "coarse": a module typically has a large logic size. The gate granularity is rather "fine": a gate typically has a very small logic size.

If module/entity granularity is used for the partitioning and floorplanning, the number of possible solutions is rather limited. This is a direct result of the "coarse" granularity of the module/entity objects. The large logic size of the module/entity objects provides for a small number of module/entity objects which results in a small number of possible solutions. Finding an optimum solution among limited number of possible solutions may not be achievable.

If gate granularity is used for the partitioning and floorplanning, the number of possible solutions is very large. This is a direct result of the "fine" granularity of the gate objects. The very small logic size of the gate objects provides for a very large number of gate objects which results in a very large number of possible solutions. Finding an optimum solution from a very large number of possible solutions can be very compute intensive.

In order to perform an effective and optimum partitioning and floorplanning of a design, an intermediate level of granularity, between the large module/entity granularity and the very small gate granularity, is required. This invention addresses the creation of this intermediate granularity in the HDL behavioral description of the design through the system and method of Process Encapsulation.

The lack of intermediate level of granularity also affects the synthesis of HDL behavioral descriptions with large logic sizes. The synthesis time of large logic size HDL behavioral description grows non-linearly with the logic size of the HDL behavioral description. Thus, for a very large logic size HDL behavioral description, the synthesis time can be prohibitive. In addition, the resulting synthesized structural gate level description of the HDL behavioral description does not retain all of the HDL signal and net names. The HDL signals are either eliminated (through optimization) or transformed in a non-deterministic fashion to a different name.

The prohibitive synthesis time for large logic size HDL behavioral descriptions and the elimination of most HDL signal names in the synthesized structural gate level description has a very negative impact on the EDA methodology of high-speed verification of ASICs using FPGAs. The prohibitive synthesis time increases the time to verification significantly. The transformation and/or elimination of HDL signal names in the synthesized structural gate level description renders the observability of HDL signal difficult or impossible. The present invention provides for a system and method of improving the synthesis time of large logic size HDL behavioral descriptions as well as retaining the HDL signal names in the synthesized structural gate level description.

SUMMARY OF THE INVENTION

The present invention provides a system and method for encapsulating HDL behavioral descriptions at the process level. The system and method for providing encapsulation of HDL behavioral descriptions at the process level includes a computer which accesses a Process Encapsulation computer program stored in computer memory. A computer processor which is electrically connected to the computer memory executes the Process Encapsulation computer program to encapsulate HDL processes as independent HDL objects within the structure of the HDL behavioral description.

The present invention provides a significant technical advantage by providing for a system and method of partitioning and floorplanning HDL behavioral descriptions at the behavioral level of abstraction.

The present invention also provides an important technical advantage by providing a system and method to increase synthesis speed of designs with large logic sizes.

The present invention provides another technical advantage by providing a system and method to retain HDL behavioral description signal names in the structural gate level description of the design.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

The present invention describes a system and method for transforming an HDL process integral to the HDL behavioral description into an independent HDL object within the structure of the HDL behavioral description. The system and method for providing encapsulation of HDL behavioral descriptions at the process level includes a computer which accesses a Process Encapsulation computer program stored in computer memory. A computer processor which is electrically connected to the computer memory executes the Process Encapsulation computer program to encapsulate HDL processes as independent HDL objects within the structure of a HDL behavioral description.

Figure 1:
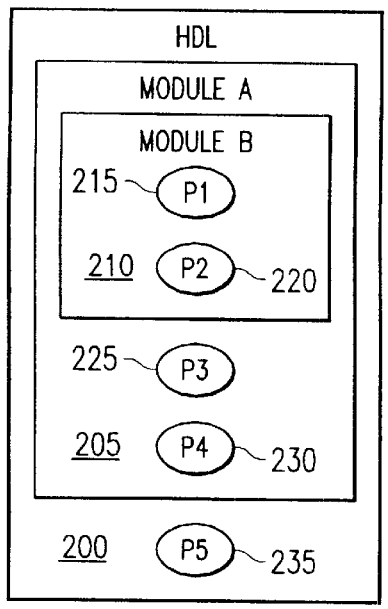
FIG. 1 shows a HDL behavioral description with no process encapsulation.

FIG. 1 shows a HDL behavioral description with no process encapsulation. As shown in FIG. 1, module/entity A contains two processes: P3 and P4 as well as an instantiation of module/entity B. Module/Entity B contains only two processes: P1, P2. All processes in this HDL description: P1, P2, P3 and P4 are integral to the modules/entities that they are contained within. As shown in FIG. 1, processes P3 and P4 are present only within module/entity A and cannot be instantiated or moved into module/entity B. Processes P1 and P2 are present only within module/entity B and cannot be instantiated or moved into module/entity A. All processes: P1, P2, P3 and P4 are not treated in the HDL description as independent HDL objects.

Figure 2:
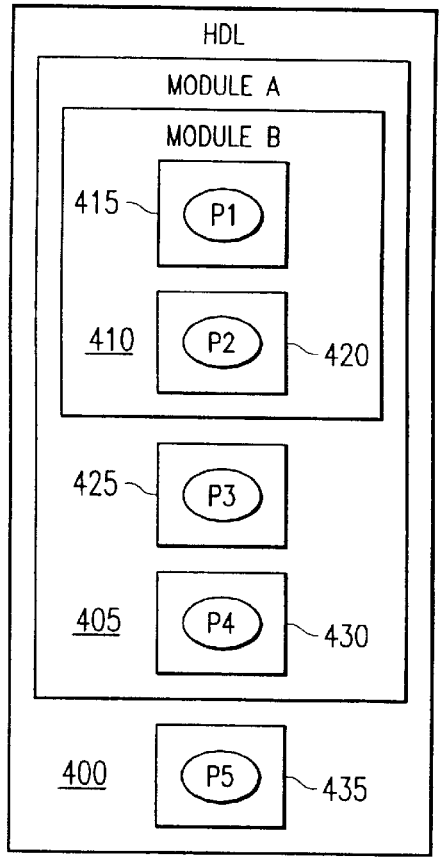
FIG. 2 shows the HDL behavioral description of FIG. 1 with process encapsulation.

FIG. 2 shows the resulting HDL description when the HDL description from FIG. 1 is encapsulated at the process level. As shown in FIG. 2, module/entity A does not contain processes P3 and P4. It contains instantiations of modules/entities P3 and P4. Module/Entity P1 contains process P1. Module/Entity,P2 contains process P2. In a similar manner, module/entity B does not contain processes P1 and P2. It contains instantiations of modules/entities P1 and P2. Module/Entity P3 contains process P3. Module/Entity P4 contains process P4. The major difference between the HDL behavioral description of FIG. 1 and the encapsulated HDL behavioral description of FIG. 2 is that in the encapsulated HDL behavioral description, the original processes P1, P2, P3 and P4 are now contained within their own modules/entities: P1, P2, P3 and P4 respectively. This in effect allows them to be treated as independent objects within the HDL behavioral description. Thus, the encapsulated HDL behavioral description provides granularity of HDL objects at the process level. This level of granularity is a key requirement for effective and optimum solution of variety of design tasks, such as HDL Floorplanning and partitioning.

It should be noted, in FIG. 2, an HDL module/entity wrapper was used to transform the integral processes within the module/entity into HDL modules/entities and thus transform them to independent HDL objects. Transforming HDL processes into HDL modules/entities is just one way of implementing process encapsulation. An internal representation to the Process Encapsulation program can also be used to transform the integral HDL processes into independent HDL objects.

Figure 3:
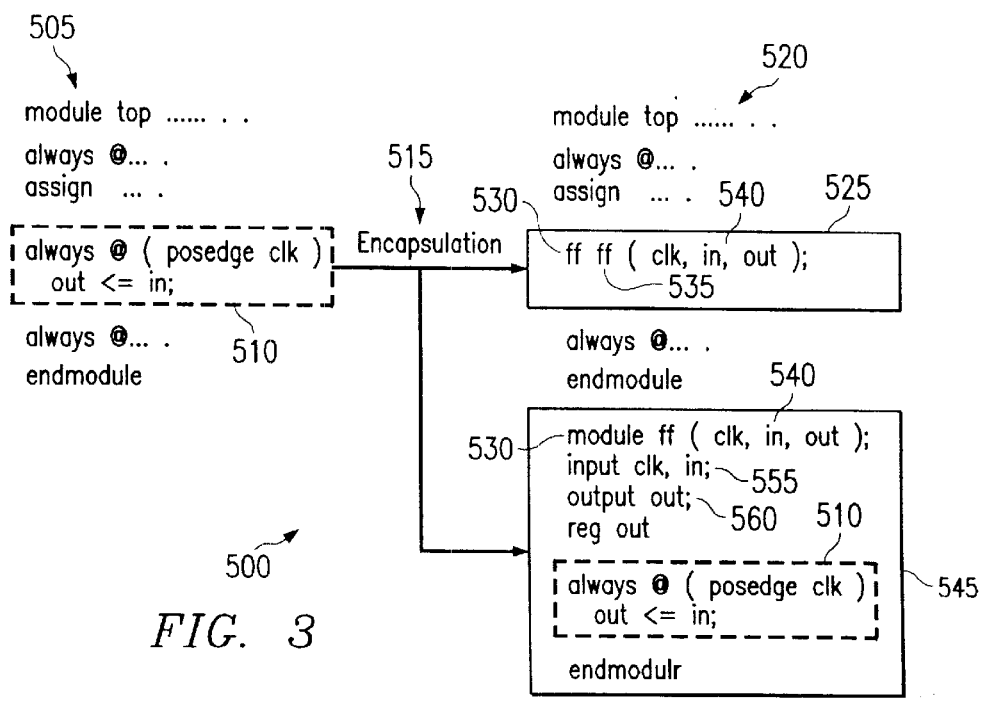
FIG. 3 shows a Verilog HDL code example before and after process encapsulation.

FIG. 3 shows one example of a HDL description in Verilog syntax before and after it has been encapsulated at the process level 500. A computer first accesses a Process Encapsulation computer program stored on a memory. A computer processor then executes the Process Encapsulation computer program to first read in the HDL description 505. The Process Encapsulation computer program then looks for a process 510 or multiple processes within the HDL description 505. The Process Encapsulation computer program then encapsulates 515 the HDL process 510 and generates an instantiation of a process module 525 for the process 510 and also generates a module 545 containing the HDL description of the process 510.

It should be understood that each HDL process can be encapsulated independently of the other HDL processes within the structure of the HDL description. A group of HDL processes can be also encapsulated as a single HDL object within the structure of the HDL description. The instantiation of the process module is comprised of a module name 530, an instantiation name 535, and a port list 540 which contains all the input and output signal names of the process 510. The module 545 is comprised of the module name 530, the port list 540, a port type declaration list (555 and 560), and the HDL process description 510. It should be further understood that in the embodiment described in FIG. 3, the process 510 was encapsulated into a Verilog module. Transforming processes into modules using standard HDL constructs is just one way of accomplishing process encapsulation. The encapsulated process can be also represented by any other means (examples include a defined file format or an internal data structure to the Encapsulation program).

Figure 4:
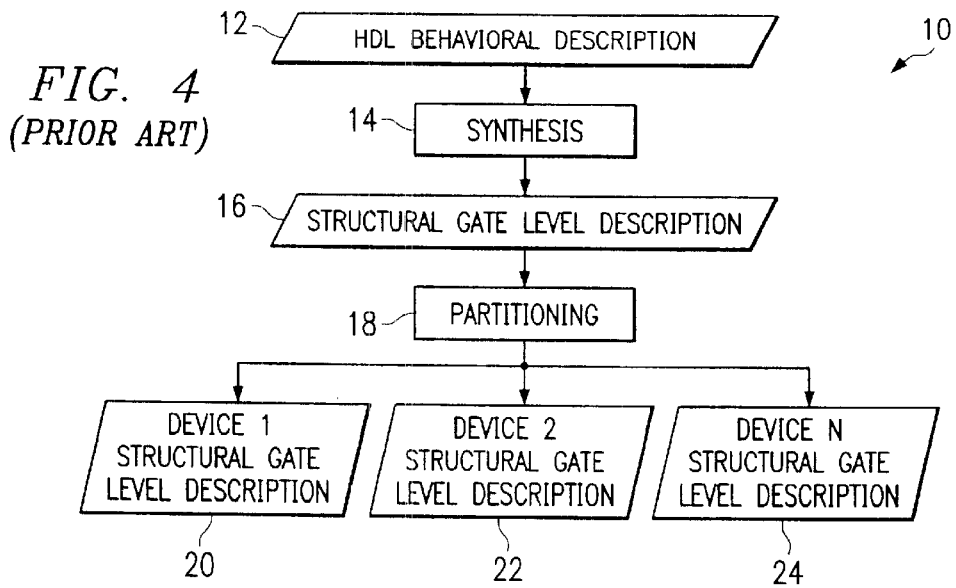
FIG. 4 shows the prior art method for partitioning a HDL behavioral description.

In one embodiment, the present invention addresses the partitioning of a HDL behavioral description. FIG. 4 shows flow diagram 10 to illustrate a prior art flow process for partitioning a HDL description. The base HDL behavioral description 12 is transformed (typically with an aid of a synthesis tool) at step 14 into a structural gate level description 16. The structural gate level description 16 contains gate objects and/or module objects. This structural gate level description is then partitioned at step 18 into multiple devices (shown as device one 20, device two 22 up to device N 24. The output of the partitioning is a structural gate. level description for each device. The major drawback of this approach is the level of granularity for achieving an effective partitioning solution is non-optimum. The level of granularity is either too coarse (module objects) or very fine (gate objects). The coarse level of granularity severely limits the number of possible partitioning solutions and in some cases does not achieve a partitioning solution. The very fine level of granularity provides for a very large number of possible partitioning solutions, and finding an optimum one becomes a very computation-intensive task. Partitioning at the gate level also has a very negative impact on performance of the partitioned design.

Figure 5:
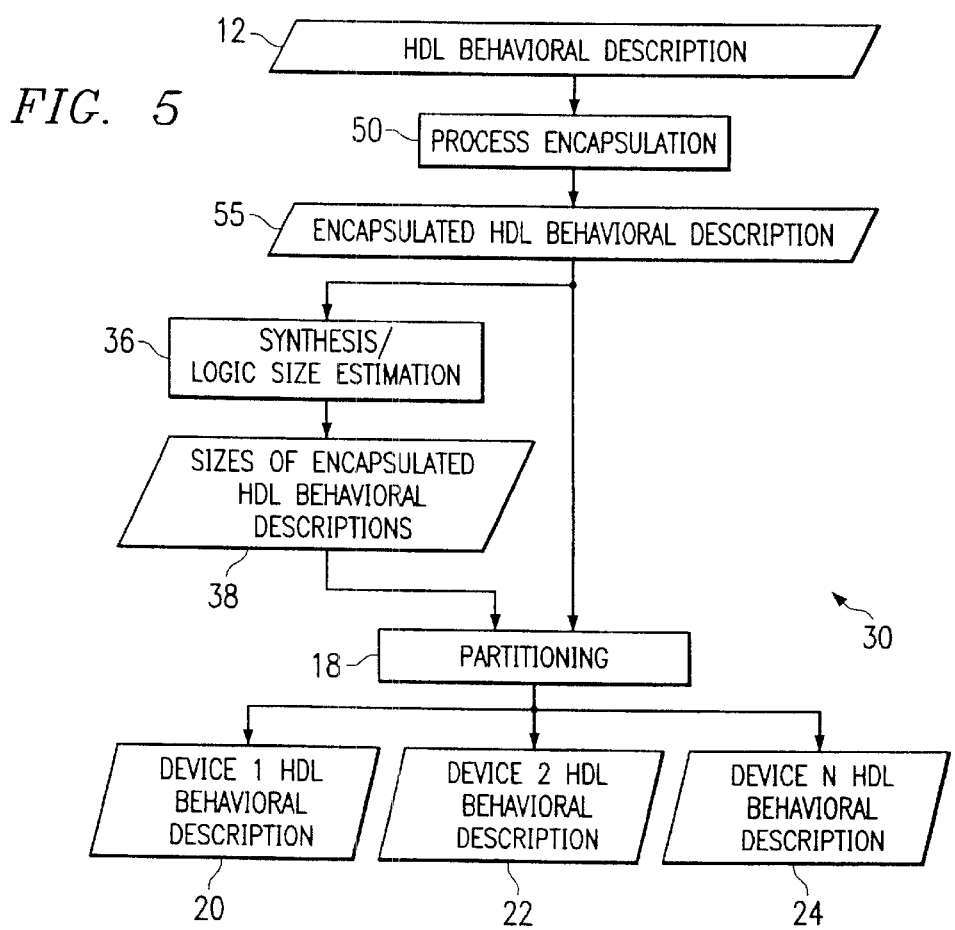
FIG. 5 shows the method of partitioning a HDL behavioral description using the present invention.

FIG. 5 shows a flow diagram 30 of a method of partitioning a HDL behavioral description using the present invention. The behavioral HDL description 12 is encapsulated at the process level prior to partitioning at step 50. This creates an encapsulated HDL behavioral description 55 of an intermediate level of granularity, between the "coarse" module granularity and the "fine" gate granularity, that is optimum for achieving an effective partitioning. The logic size of each encapsulated process 55 can be computed prior to the partitioning step using a logic size estimation function or synthesis at step 36. The partitioning step 18 uses the encapsulated HDL description 55 and the logic size of each of the encapsulated processes 38 to produce an effective partition at the HDL behavioral level of abstraction. The output of the partitioning step is HDL behavioral description for each device.

Figure 6:
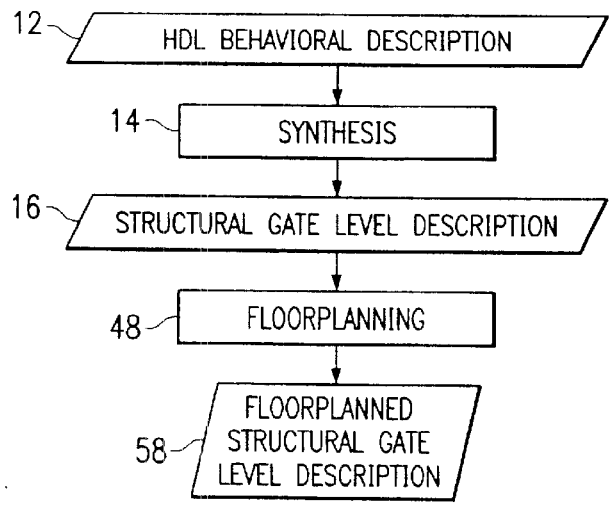
FIG. 6 shows the prior art method for floorplanning a HDL behavioral description.

In another embodiment, the present invention addresses the floorplanning of a HDL behavioral description. FIG. 6 shows the prior art method for floorplanning a HDL description . The HDL behavioral description 12 is transformed (typically with an aid of a synthesis tool) into a structural gate level description at step 14. The structural gate level description 16 contains gate objects and/or module objects. This structural gate level description 16 is then floorplanned at step 48. The output of the floorplanning step is floorplanned structural gate level description 58.

The major drawback of this approach is that the level of granularity for achieving an effective floorplanning solution is non-optimum. The level of granularity is either too coarse (module objects) or very fine (gate objects). The coarse level of granularity does severely limit the number of possible floorplanning solutions. The very fine level of granularity provides for very large number of possible floorplanning solutions, and finding an optimum one becomes a very computation-intensive task.

Figure 7:
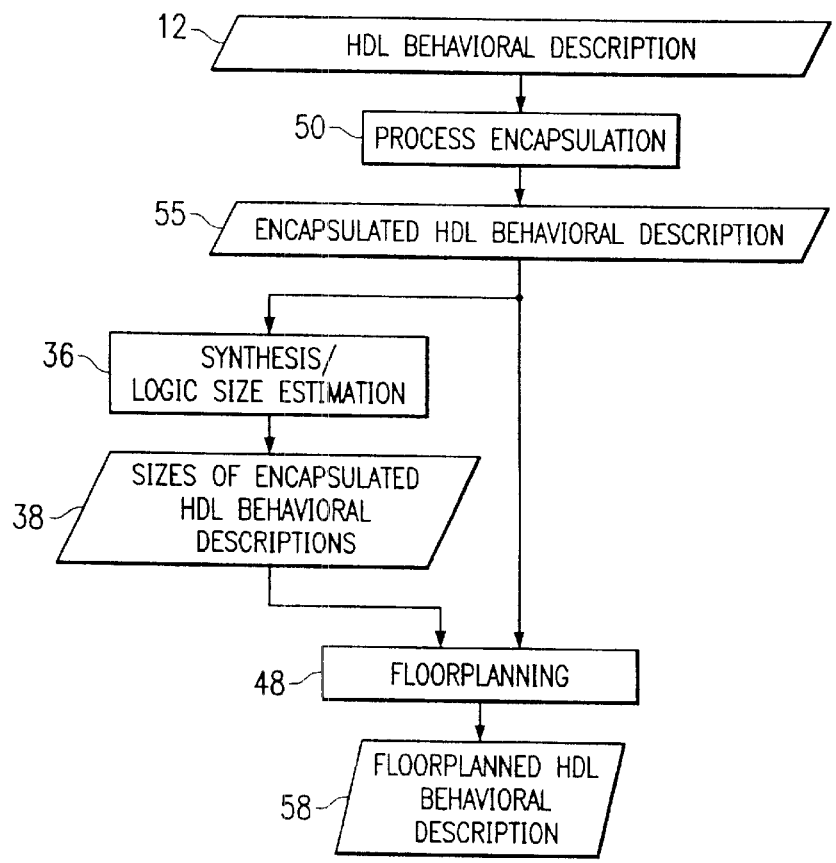
FIG. 7 shows the method of floorplanning a HDL behavioral description using the present invention.

FIG. 7 shows the method of floorplanning a HDL behavioral description using the present invention. The behavioral HDL description 12 is encapsulated at the process level prior to floorplanning. This creates an encapsulated HDL behavioral description 55 that has an intermediate level of granularity between the "coarse" module granularity and the "fine" gate granularity, that is optimum for achieving an effective floorplanning. The logic size of each encapsulated process is computed at step 36 prior to the floorplanning step 48 using a logic size estimation function or synthesis. The floorplanning step 48 uses the encapsulated HDL description 55 and the logic size of each of the encapsulated processes 38 to produce and effective floorplan at the HDL behavioral level of abstraction. The output of the floorplanning step is floorplanned HDL behavioral description 58.

Figure 8:
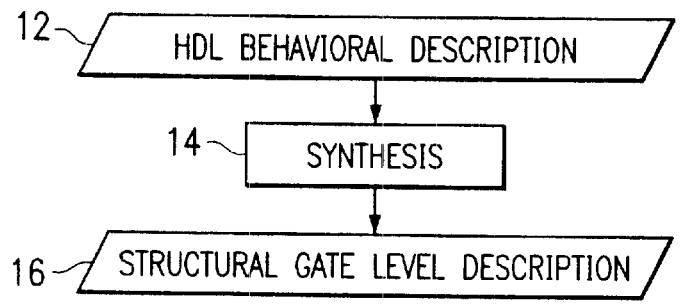
FIG. 8 shows the prior art method of synthesizing a HDL behavioral description.
Figure 9:
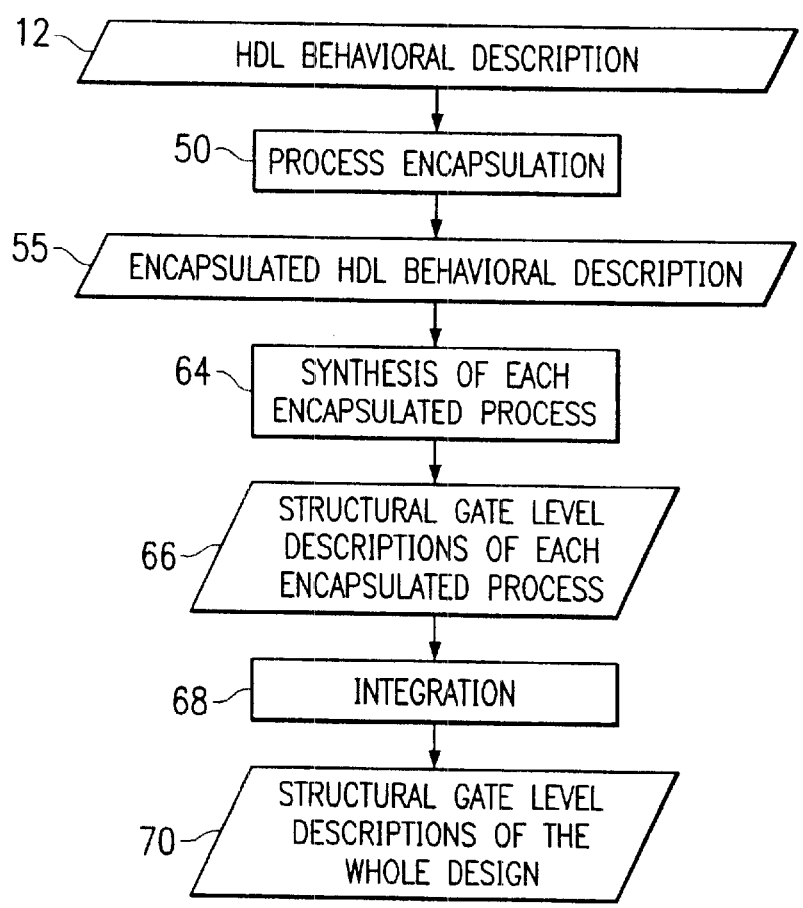
FIG. 9 shows the method of synthesizing a HDL behavioral description using the present invention.

The present invention can also address the performance bottleneck of synthesizing an HDL behavioral description with large logic size. FIG. 8 shows the prior art method for synthesizing a HDL behavioral description into a structural gate level description 16. As shown in FIG. 8, the synthesis task is performed on the whole HDL description 12 at step 14. The time required to synthesize the whole HDL behavioral description grows nonlinearly with the logic size of the HDL behavioral description, since the synthesis tool performs global optimization across the complete HDL behavioral description. Thus, for large logic size designs, the synthesis time can be prohibitive and in most cases impractical. FIG. 9 shows the method of synthesizing a HDL behavioral description using the present invention. The behavioral HDL description 12 is encapsulated at the process level at step 50 prior to synthesis. This in effect breaks up the large HDL behavioral description into a number of smaller HDL behavioral descriptions (i.e., the encapsulated HDL processes 55). Each encapsulated process 55 is then synthesized individually at step 64 which produces a structural gate level description 66 for each encapsulated process. The complete structural gate level of the whole HDL behavioral description is created by the integration step 68 to produce structural gate level descriptions of the entire design 70.

The key advantage of this approach is much improved synthesis time for the whole HDL behavioral description. The synthesis time of the whole HDL behavioral description is a sum of the synthesis times of all the encapsulated processes. The net effect is that the total synthesis time is linear with the number of encapsulated processes and therefore with the logic size of the HDL behavioral description.

FIG. 9 also illustrates how the present invention addresses the problem of preserving the signal names of HDL behavioral description in the synthesized structural gate level description. In the FIG. 8 prior art method of synthesizing a design, the synthesis task is performed on the whole HDL description. By performing the synthesis task on the whole HDL behavioral description, HDL signals can get optimized away and/or transformed (in non-deterministic ways) to different names in the resulting synthesized structural gate level description. The present invention, as shown in FIG. 9, preserves HDL signal names at the process boundaries. The behavioral HDL description is encapsulated at the process level prior to synthesis. This in effect breaks up the large HDL behavioral description into a number of smaller HDL behavioral descriptions (i.e., the encapsulated HDL processes). Each encapsulated process is then synthesized individually which produces a structural gate level description for each process. The complete structural gate level of the whole HDL behavioral description is created by the integration step of all structural gate level descriptions of the individual encapsulated processes. An important advantage of this approach is that the resulting structural gate level description contains all the original HDL behavioral description signal names present at the process boundaries.

In summary, the present invention provides a system and method for encapsulating HDL process descriptions to provide granularity at the process level. The system and method for providing encapsulation of HDL descriptions at the process level includes a computer which accesses a Process Encapsulation computer program stored in computer memory. A computer processor which is electrically connected to the computer memory executes the Process Encapsulation computer program to encapsulate HDL processes as entities within the structure of a HDL description.

Although the present invention has been described in detail, it should be understood that various changes, substitutions and alterations can be made hereto without departing from the spirit and scope of the invention as described by the appended claims.

What is claimed is:

1. A system for encapsulating within a structure of an HDL behavioral description, an HDL process that was not originally written as an encapsulated process, comprising:

a computer operable to access a Process Encapsulation computer program, said computer comprising:

a memory operable to store said Process Encapsulation computer program;

a processor electrically connected to said memory, said processor operable to execute said Process Encapsulation computer program to encapsulate, as an independent HDL object within the structure of said HDL behavioral description, said HDL process that was not written as an encapsulated process.

2. The system of claim 1, wherein said processor is further operable to execute said Process Encapsulation computer program to:

move a HDL object within the structure of said HDL behavioral description; and maintain all original HDL signal names in a structural gate level description of said HDL behavioral description.

3. The system of claim 1, wherein said HDL object is any of the following: HDL module, HDL entity, HDL gate, encapsulated HDL process, data structure internal to the Encapsulation Program.

4. The system of claim 1, wherein each said HDL process is encapsulated independently of other processes within the structure of said HDL behavioral description.

5. The system of claim 1, wherein a group of HDL processes is encapsulated as a single HDL object within the structure of said HDL behavioral description.

6. A method for encapsulating, within a structure of an HDL behavioral description, an unencapsulated HDL process, comprising:

read within the structure of said HDL behavioral description, an unencapsulated HDL process;

generate an HDL object containing said HDL process; and replace said unencapsulated HDL process with an instantiation of said HDL object.

7. The method of claim 6, wherein said HDL object comprises a HDL object name, a port list, and said HDL process.

8. The method of claim 6, wherein said HDL object instantiation comprises an HDL object name, an instance name, and an instantiation port list.

9. The method of claim 6, wherein multiple HDL processes within the structure of said HDL behavioral description are encapsulated independently of one another.

10. The system of claim 6, wherein a group of HDL processes is encapsulated as a single HDL object within the structure of said HDL behavioral description.

11. A Process Encapsulation computer program contained in computer-readable form on a tangible storage medium executable to:

read an unencapsulated HDL process within a structure of HDL behavioral description;

generate an HDL object containing said HDL process; and replace said unencapsulated HDL process with an instantiation of said HDL object.

12. The Process Encapsulation computer program of claim 11, further executable to:

move any HDL object within the structure of said HDL behavioral description; and maintain all original HDL signal names in a structural gate level description of said HDL behavioral description.

13. The Process Encapsulation computer program of claim 11, wherein said HDL object comprises a HDL object name, a port list, and said HDL process.

14. The Process Encapsulation computer program of claim 11, wherein said HDL object instantiation comprises an HDL object name, an instance name, and an instantiation port list.

15. The Process Encapsulation computer program of claim 11, wherein an object name links said instantiation of said HDL object to said HDL object.

16. The system of claim 11, wherein said HDL object is any of the following: HDL module, HDL entity, HDL gate, encapsulated HDL process, data structure internal to the Encapsulation Program.

17. The Process Encapsulation computer of claim 11, wherein each said HDL process is encapsulated independently of other processes within the structure of said HDL behavioral description.

18. The Process Encapsulation computer program of claim 11, wherein a group of HDL processes is encapsulated as a single HDL object within the structure of said HDL behavioral description.

* * * * *